United States Patent [19]

Drapac

[11] 4,320,350

[45] Mar. 16, 1982

[54] SLIDING POWER SUPPLY FOR RF POWER AMPLIFIER

[75] Inventor: Michael J. Drapac, Cedar Rapids, Iowa

[73] Assignee: Rockwell International Corporation, El Segundo, Calif.

[21] Appl. No.: 98,565

[22] Filed: Nov. 29, 1979

[51] Int. Cl.³ .............................................. H03F 1/02
[52] U.S. Cl. .................................... 330/202; 330/285; 330/297
[58] Field of Search .................... 330/202, 207 P, 285, 330/297, 298; 455/127, 343

[56] References Cited

U.S. PATENT DOCUMENTS

| 3,449,680 | 6/1969 | Schilb et al. | 330/298 |
| 3,644,832 | 2/1972 | Sherman | 455/127 |

Primary Examiner—James B. Mullins
Attorney, Agent, or Firm—Richard K. Robinson; Howard R. Greenberg; H. Fredrick Hamann

[57] ABSTRACT

A sliding power supply for a radio frequency power amplifier provides power to the power amplifier that is indirectly controlled by the load impedance voltage standing wave ratio of the amplifier. The overall results being an enhancement or improvement in the efficiency of the RF power amplifier into a varying RF load mismatch.

4 Claims, 2 Drawing Figures

SLIDING POWER SUPPLY FOR RF POWER AMPLIFIER

BACKGROUND OF THE INVENTION

This invention relates to power supplies for RF amplifiers and in particular to a sliding power supply for RF amplifiers.

The state of the art of power supply design for power amplifiers provides for a constant level voltage source to power the power amplifier. This technique causes excess power to be dissipated in the RF power transistor when the power amplifier is subjected to a low load impedance phase angle of the voltage standing wave ratio. However, under the condition with high load impedance phase angle of the voltage standing wave ratio then a high level of DC voltage is required. Since the high voltage and high current requirements of the power amplifier never occur simultaneously, the power amplifier circuits and in particular the transistors are, under low load impedance, required to dissipate exceptionally high currents. This requirement necessitates the selection of high power rated components and the heat sinking and cooling of these components.

Attempts have been made in the art to compensate for RF load voltage standing wave ratio, varying phase angles of voltage standing wave ratio and/or both. The prior Art provided for, as was disclosed in U.S. Pat. No. 3,366,883, the attenuation of the output of the power amplifier without adjusting the power consumption of the power amplifier.

Theoretical RF power amplifiers using ideal RF amplifying devices require varying voltage and current to maintain maximum efficiency into the varying RF load voltage standing wave ratio, varying phase angles of voltage standing wave ratio and/or both. Practical RF power amplifiers exhibit similar voltage and current requirements characteristic of their ideal counterparts but not necessarily limited to those characteristics.

SUMMARY OF THE INVENTION

A sliding power supply for a radio frequency power amplifier provides power to the power amplifier that is indirectly controlled by the load impedance voltage standing wave ratio of the amplifier. The overall results being an enhancement or improvement in the efficiency of the RF power amplifier into a varying RF load mismatch.

The disclosed power supply through the utilization of a feedback loop ensures that both the current and the voltage to the power amplifier are limited to the power requirements of the load voltage standing wave ratio of the amplifier.

The direct current power to the amplifier is established by a preselected function and the power supply will provide a desired voltage at the power amplifier based upon the sensed current to the power amplifier or a desired current to the power amplifier based upon the sensed voltage at the power amplifier.

The power supply's operating characteristics can be determined for bipolar radio frequency power amplifiers, V-FET RF-power amplifiers, and even tube-types RF power amplifiers.

The advantages of the present invention may be ascertained from a reading of the specification and claims in conjunction with the drawings.

DETAILED DESCRIPTION OF THE PREFERRED EMBODIMENT

Figure 1:
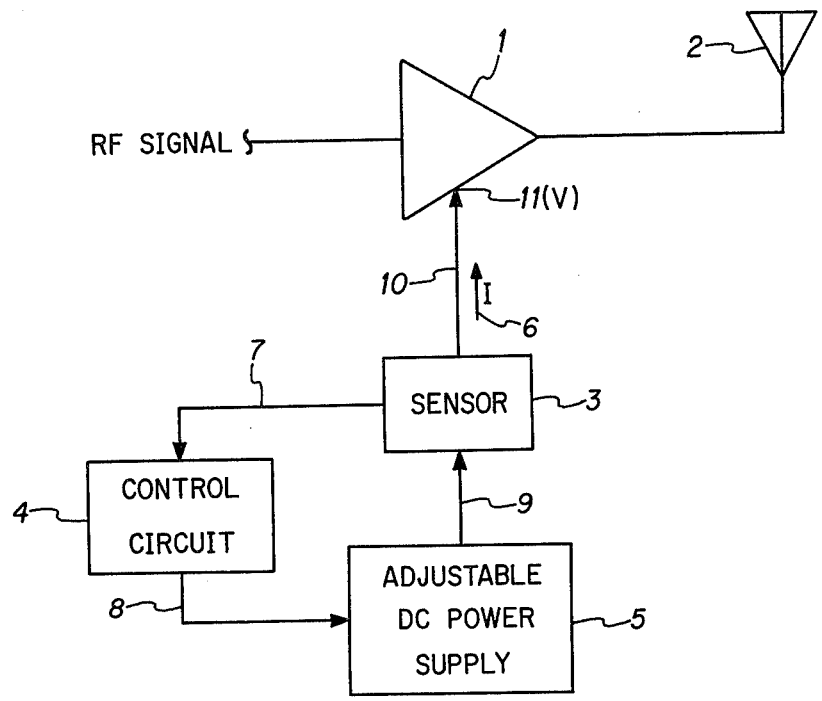
FIG. 1 is a block diagram of an RF amplifier whose power is supplied by a sliding power supply according to the invention.

In FIG. 1 to which reference should now be made, there is shown an RF power amplifier 1 which amplifies a radio frequency (RF) signal from a source (not shown) and drives a load such as an antenna 2. The load as seen by the power amplifier is a variable load which is subject to mismatched conditions in particular the voltage standing wave ratio, which could be caused by the changing of operating frequency, environmental conditions, production tolerances, other causes or combinations of causes. The operation of the RF amplifier is controlled or efficiently modulated by the sliding power supply which consists of a signal sensor 3, a control circuit 4, and an adjustable DC power supply 5 which are connected together by conductors 7, 8 and 9. The connection to the RF amplifier 1 is made by conductor 10. The control of the adjustable DC power supply 5 improves the operating efficiency of the RF power amplifier under voltage standing wave ratio conditions of the RF load, which in the case of FIG. 1 is represented by the antenna 2.

Figure 2:
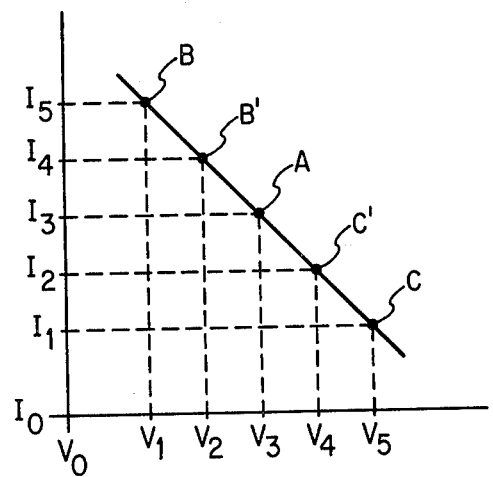
FIG. 2 is a graph which illustrates the voltage and current relationship of the sliding power supply of FIG. 1.

As the RF power amplifier 1 draws more current I, as indicated by arrow 6, than its quiescence of operating current under matched load conditions, the voltage V at the power amplifier, as indicated at point 11, is reduced according to a calculated or empirically determined function or curve. The cause for an increase in current I is a voltage standing wave ratio increase from a normal matched condition to a mismatched condition or a change in the phasing of the voltage standing wave ratio. A matched load on the RF power amplifier requires a power rating as indicated by point A on FIG. 2 in which the abscissa represents, for purposes of discussion only, an arbitrarily selected range of voltages from $V_0$ through $V_5$, and the ordinate represents similarly an arbitrarily selected range of currents $I_0$ through $I_5$. The adjustable DC power supply 5 will provide for a matched load on the RF power amplifier as indicated on FIG. 2 at point A a voltage $V_3$ and a current $I_3$ that enables the RF power amplifier to operate at its rated power output. As the voltage standing wave ratio increases, the operating current I and voltage V goes to point B' and B of FIG. 2. At a constant voltage standing wave ratio, if the voltage standing wave ratio phase angle changes the operating point will change from either B or B' to C' or C in the extremes. This operating requirement of DC voltage and current is caused by the power amplifier itself and not caused by the power supply or control loop. The adjustable DC power supply 5, and control loop, operate by sensing either the current or voltage by the sensor 3 of FIG. 1 and matching it to the RF power amplifier's operating requirements.

The output of the sliding power supply is controlled by the sensor 3 which can be either a voltage or current sensor that will sense the desired signal either voltage or current dependent upon the type of sensor and generate a correcting signal which is carried to the control circuit 4 by conductor 7. The control circuit 4 either varies the output voltage of the power supply 5 if the sensor is a current sensor or adjusts the current from the adjustable DC power supply if the sensor 3 is a voltage sensor with the overall results being an enhancement or improvement in the efficiency of the RF power amplifier into varying RF load's mismatch. In fact the characteristics of the RF load indirectly controls the power to the RF power amplifier by the relationship of the current $I=(Z+I)K$ where K is a readily determined constant dependent upon the characteristic of the power amplifier and Z the impedance of the load as seen by the adjustable DC power supply 5.

In line with this relationship the output voltage V of the power supply is $$V = \frac{ZK}{Z+1}.$$

An alternate expression for the voltage and current is, I is proportional to $1+\rho$ and V is proportional to $1-\rho$. $\rho$ is the reflector coefficient and $$\rho = \frac{Z_L - Z_0}{Z_L + Z_0}$$

where $Z_L$ is the load impedance and $Z_0$ is nominal matched load impedance. The relationships discussed above are linear. However, they need not be necessarily linear but can be other mathematical forms such as parabolic, hyperbola, etc., to match empirical or measured data.

Many changes and modifications in the above described embodiment of the invention can, of course, be carried out without departing from the scope thereof. Accordingly, to promote the progress in science and useful arts, the invention is disclosed and is intended to be limited only by the scope of the appended claims.

I claim:
1. A sliding power supply for a radio frequency power amplifier with a variable power supply input impedance Z, comprising:
   power supply means for providing a direct current signal to the radio frequency power amplifier;
   current sensor means for sensing the direct current signal to the radio frequency power amplifier; and
   control circuit means for controlling the voltage from the power supply means such that when the variable power supply input impedance of the power amplifier is low the direct current voltage is raised in response to the current sensed by the current sensor means and when the variable power supply impedance is high, the direct current voltage is lowered in response to the current sensed by the current sensor means.

2. The sliding power supply according to claim 1 wherein the control circuit means, comprises:
   means for adjusting the direct current voltage such that the voltage is equal to $$\frac{ZK}{Z+1}.$$

where K is a preselect constant.

3. A sliding power supply for a radio frequency power amplifier with a variable power supply input impedance Z, comprising:
   power supply means for providing a direct current signal to the radio frequency power amplifier;
   voltage sensor means for sensing the direct current voltage at the radio frequency power amplifier; and
   control circuit means for controlling the direct current signal such that when the variable power supply input impedance of the power amplifier is low, the direct current signal is raised in response to the voltage sensed by the voltage sensor means and when the variable power supply impedance is high, the direct current signal is lowered in response to the voltage sensed by the voltage sensor means.

4. The sliding power supply according to claim 3 wherein the control cicuit means, comprises:
   means for adjusting the direct current such that the current is equal to $K(Z+1)$ where K is a preselect constant.

* * * * *